US011382212B2

(12) United States Patent
Sasagawa et al.

(10) Patent No.: US 11,382,212 B2
(45) Date of Patent: Jul. 5, 2022

(54) INPUT DEVICE WITH REINFORCEMENT PLATE AND WIDER GROUNDING WIRE

(71) Applicant: Alps Alpine Co., Ltd., Tokyo (JP)

(72) Inventors: Hideto Sasagawa, Niigata-ken (JP); Takashi Asakawa, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 228 days.

(21) Appl. No.: 16/852,170

(22) Filed: Apr. 17, 2020

(65) Prior Publication Data

US 2020/0245454 A1 Jul. 30, 2020

Related U.S. Application Data

(63) Continuation of application No. PCT/JP2018/041021, filed on Nov. 5, 2018.

(30) Foreign Application Priority Data

Nov. 22, 2017 (JP) .............................. JP2017-224591

(51) Int. Cl.
*H05K 1/02* (2006.01)
*G06F 3/044* (2006.01)
(Continued)

(52) U.S. Cl.
CPC ........... *H05K 1/0281* (2013.01); *G06F 3/044* (2013.01); *G06F 3/04164* (2019.05);
(Continued)

(58) Field of Classification Search
CPC . H05K 2201/2009; H05K 2201/09727; H05K 2201/09236; H05K 2201/09081;
(Continued)

(56) References Cited

U.S. PATENT DOCUMENTS

2007/0134945 A1 6/2007 Kataoka
2008/0062140 A1* 3/2008 Hotelling .............. G02F 1/1362
345/173

(Continued)

FOREIGN PATENT DOCUMENTS

JP 01-157588 6/1989
JP 02-116731 U 9/1990
(Continued)

OTHER PUBLICATIONS

International Search Report from International Application No. PCT/JP2018/041021 dated Jan. 8, 2019.

*Primary Examiner* — Liliana Cerullo
(74) *Attorney, Agent, or Firm* — Beyer Law Group LLP

(57) ABSTRACT

An input device includes a support base, a sensor unit including electrode portions, an extended portion extending outward from the support base, a lead-out wire in conduction with the electrode portions, a grounding wire adjacent to the lead-out wire, the lead-out wire and the grounding wire being along a first major surface of the extended portion, and a reinforcement plate on a part of a second major surface opposite to the first major surface and on the side of the support base from the tip. When viewed from a normal direction of the second major surface, the grounding wire is greater than the lead-out wire, an end-portion projection line formed by a support-base-side end portion of the reinforcement plate is nonlinear, and a most-protruding location in the
(Continued)

end-portion projection line closest to the support base overlaps the grounding wire.

7 Claims, 7 Drawing Sheets

(51) Int. Cl.
 *H05K 1/11* (2006.01)
 *G06F 3/041* (2006.01)
 *H05K 1/09* (2006.01)

(52) U.S. Cl.
 CPC .... *H05K 1/118* (2013.01); *G06F 2203/04102* (2013.01); *H05K 1/09* (2013.01); *H05K 2201/09081* (2013.01); *H05K 2201/09236* (2013.01); *H05K 2201/09727* (2013.01); *H05K 2201/2009* (2013.01)

(58) Field of Classification Search
 CPC ........ H05K 1/118; H05K 1/09; H05K 1/0281; G06F 2203/04102; G06F 3/04164
 See application file for complete search history.

(56) References Cited

U.S. PATENT DOCUMENTS

| | | | | |
|---|---|---|---|---|
| 2009/0135364 | A1* | 5/2009 | Lee | ........................ H05K 1/118 349/149 |
| 2010/0085326 | A1* | 4/2010 | Anno | ................. H03K 17/9622 345/174 |
| 2012/0075218 | A1 | 3/2012 | Lin et al. | |
| 2014/0192309 | A1 | 7/2014 | Nakagawa et al. | |
| 2016/0147335 | A1 | 5/2016 | Nishizawa et al. | |

FOREIGN PATENT DOCUMENTS

| | | |
|---|---|---|
| JP | 08-18174 | 1/1996 |
| JP | 2005-093447 | 4/2005 |
| JP | 2005-191162 | 7/2005 |
| JP | 2007-165490 | 6/2007 |
| JP | 2008-090112 | 4/2008 |
| JP | 2014-132299 | 7/2014 |
| JP | 2014-219963 | 11/2014 |
| JP | 2015-141701 | 8/2015 |
| JP | 2016-057567 | 4/2016 |
| TW | 201213946 | 4/2012 |

* cited by examiner

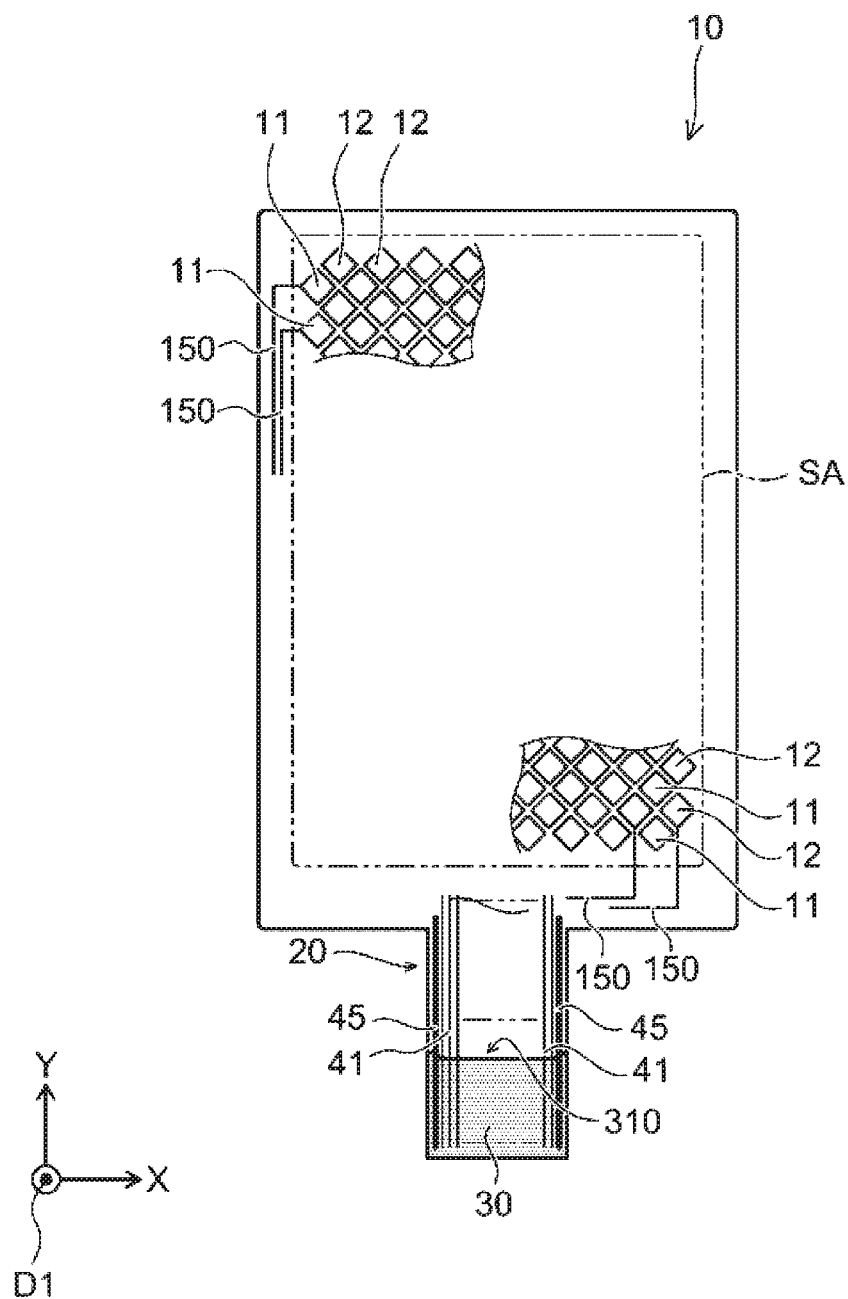

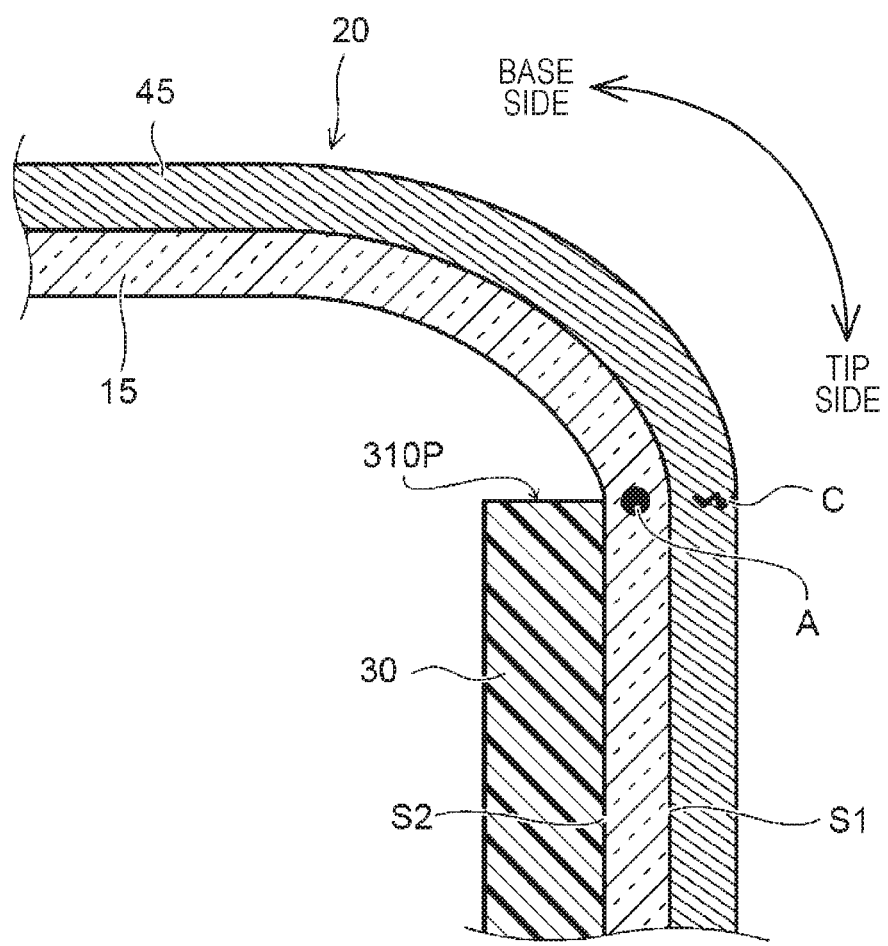

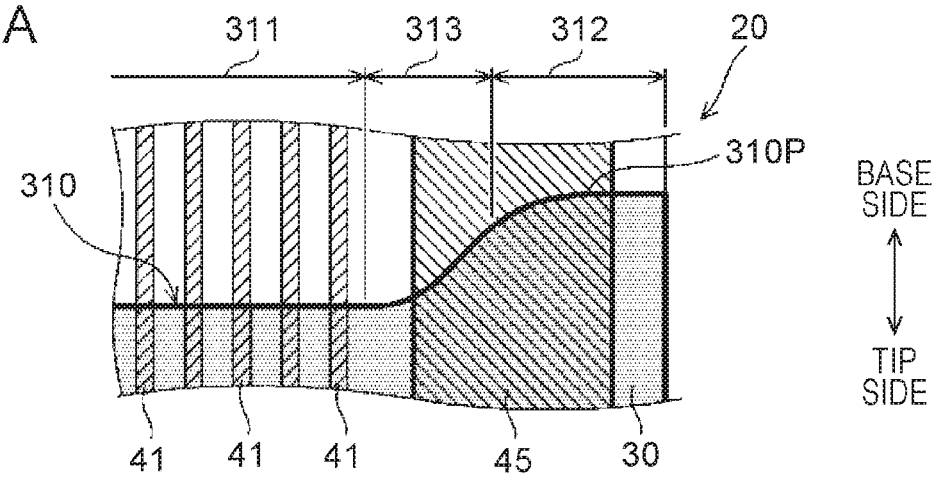
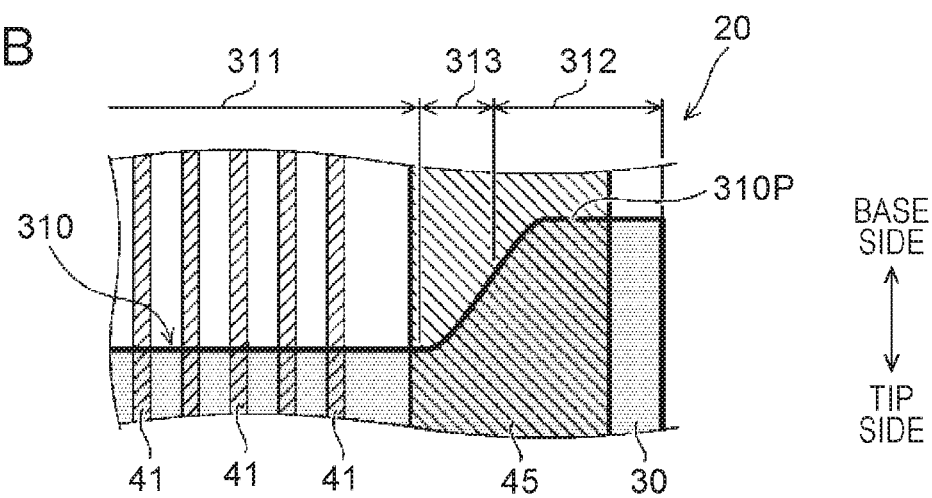
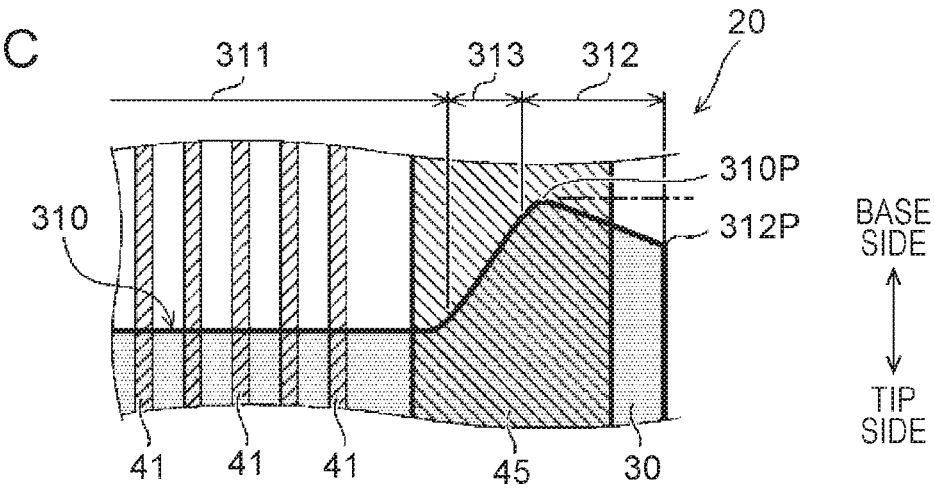

INPUT DEVICE WITH REINFORCEMENT PLATE AND WIDER GROUNDING WIRE

CLAIM OF PRIORITY

This application is a Continuation of International Application No. PCT/JP2018/041021 filed on Nov. 5, 2018, which claims benefit of Japanese Patent Application No. 2017-224591 filed on Nov. 22, 2017. The entire contents of each application noted above are hereby incorporated by reference.

BACKGROUND OF THE INVENTION

1. Field of the Invention

The present invention relates to an input device and relates, in particular, to an input device including a touch sensor that detects a position at which a finger or the like has approached thereto.

2. Description of the Related Art

A touch panel commonly utilized as an input device includes, in a detection region, a touch sensor that detects a position at which a finger or the like has approached (note that, hereinafter, approach includes contact) thereto. For example, a mutual capacitive touch panel is provided with a drive-side electrode and an output-side electrode, and a capacitance change due to approach of a finger or the like is detected by the output-side electrode in response to a drive pulse being applied to the drive-side electrode.

In such a touch panel, an extended portion extending outward from a support base is disposed on a panel peripheral portion to obtain conduction with a detection-use electrode. The extended portion is a flexible circuit board, and a lead-out wire in conduction with the electrodes in the detection region and a grounding wire that serves as a ground potential are formed thereon. At the tip of the extended portion, a terminal for connection to an external connecter is disposed. In some products on which such a touch panel is set, the extended portion extending from the touch panel is required to be connected to a connector by being handled while being curved.

The extended portion is relatively thin, and thus, a reinforcement plate is attached to a tip part thereof for connection to a connecter. When such an extended portion is curved, there is a possibility of a malfunction, such as cracks and breakage, occurring in the lead-out wire that is bent together with the extended portion.

Japanese Unexamined Patent Application Publication No. 1-157588 discloses a flexible printed circuit board on which a reinforcement plate is mounted in which the shape of an end portion of the reinforcement plate is configured such that a center portion in the width direction is recessed. Japanese Unexamined Patent Application Publication No. 8-018174 discloses a flexible printed circuit board that prevents, when a portion of the double-sided flexible printed circuit board is bent, cracks from being generated in the vicinity of a bend start line. In the flexible printed circuit board, bending rigidity in the vicinity of the bend start line is increased by disposing a lingulate extending piece extending from a cover film.

Japanese Unexamined Patent Application Publication No. 2016-057567 discloses a flexible board that suppresses generation of wire breakage. The flexible board is configured such that a bending stress generated when an external force is applied to the flexible board is dispersed by changing the position of the tip of a terminal.

Japanese Unexamined Patent Application Publication No. 2005-093447 discloses a flexible circuit board in which the strength of a border portion between a cover film and a metal layer of the flexible circuit board with respect to bending and torsion is increased. In the flexible circuit board, the width thereof is formed to be wide in the vicinity of the border portion exposed from the cover film on the metal layer, and the length of the wide portion in the front-rear direction is formed to be long in a center part of the flexible circuit board and to become shorter gradually toward the left-right both-end sides.

Technical Problem

Products on which a touch panel is set are provided in various forms. Handling conditions of an extended portion that connects a touch panel to a connecter have become strict in accordance with the shape of the housing of each product, and there is a need to slightly bend the extended portion. The more the extended portion is slightly bent, the more stress due to the bending is applied to and damages the lead-out wire. The damage to the lead-out wire influences detection performance. In particular, when the extended portion is provided with a reinforcement plate, the stress is concentrated on an end portion of the reinforcement plate, and it is thus important to prevent generation of cracks in the lead-out wire and wire breakage thereof.

SUMMARY OF THE INVENTION

The present invention provides an input device capable of suppressing, even when an extended portion provided with a reinforcement plate is curved, damage to a lead-out wire disposed on the extended portion.

To solve the aforementioned problem, one aspect of the present invention provides an input device including: a support base; a sensor unit disposed on the support base and including a plurality of electrode portions; an extended portion extending outward from the support base; a lead-out wire disposed along a first major surface of the extended portion and in conduction with the electrode portions; a grounding wire disposed adjacent to the lead-out wire along the first major surface of the extended portion; and a reinforcement plate disposed in a partial region of a second major surface opposite to the first major surface of the extended portion, the partial region being on a side of the support base from a tip of the extended portion. When viewed in a normal direction of the second major surface of the extended portion, a wire width of the grounding wire is greater than a wire width of the lead-out wire, an end-portion projection line formed by an end portion of the reinforcement plate on the side of the support base is a nonlinear line, and a most-protruding location in the end-portion projection line closest to the side of the support base overlaps the grounding wire.

According to such a configuration, when the extended portion extending from the support base is curved, a stress is concentrated on the vicinity of the most-protruding location in an end portion (base-side end portion) of the reinforcement plate on the base side closest to the side of the support base. Due to the end-portion projection line formed by the base-side end portion being the nonlinear line and the most-protruding location being disposed at a location overlapping the grounding wire, it is possible to cause a stress-concentrated portion when the extended portion is curved to be on the grounding wire, and it is possible to avoid stress concentration onto the lead-out wire. Due to the wire width of the grounding wire being greater than the wire width of the lead-out wire, even when a stress is concentrated on the grounding wire, damage thereto is small.

In the aforementioned input device, the end-portion projection line may include a first part overlapping at least the lead-out wire, a second part overlapping the grounding wire and including the most-protruding location, and a third part including a portion overlapping the grounding wire, the third part being disposed between the first part and the second part. Consequently, when the extended portion is curved, it is possible to concentrate the stress on the second part that includes the most-protruding location. It may be preferable, from the point of view of more stably avoiding stress concentration onto the lead-out wire, that the third part be constituted by the portion overlapping the grounding wire.

In the aforementioned input device, at least one of the first part, the second part, and the third part may be a linear line. Consequently, in the configuration of the reinforcement plate that concentrates a stress onto the vicinity of the most-protruding location when the extended portion is curved, it is possible due to the shape including the linear line to address simplification of manufacture.

In the aforementioned input device, the third part may be a part where the end-portion projection line is set back from the side of the support base toward a side of the tip, and the third part may be disposed to connect the first part and the second part to each other without a bent portion. If the end-portion projection line includes a bent portion, there is a possibility of a stress being locally high on the bent portion when the extended portion is curved. Thus, by not including the bent portion, it is possible to concentrate the stress on the most-protruding location of the second part when the extended portion is curved and to gradually decrease the stress as a distance from the most-protruding location increases.

In the aforementioned input device, the first part and the third part may be connected to each other by a curved line, and the second part and the third part may be connected to each other by a curved line. Consequently, connection portions between the first part, the second part, and the third part are connected by a smooth curved line, which enables stress concentration on the connection portions to be buffered.

In the aforementioned input device, the first part may be a part where the end-portion projection line is a linear line or set back from the side of the support base toward a side of the tip, and the second part may be a part where the end-portion projection line is a linear line or protrudes from the side of the tip toward the side of the support base. Consequently, in the configuration of the reinforcement plate that concentrates a stress on the vicinity of the most-protruding location when the extended portion is curved, it is possible to effectively avoid stress concentration onto the width-direction end portion of the extended portion overlapping the second part while effectively avoiding stress concentration onto the lead-out wire overlapping the first part.

In the aforementioned input device, the lead-out wire and the grounding wire may each contain silver. A wiring pattern containing silver is easily damaged. By employing the aforementioned configuration of the reinforcement plate, even the lead-out wire and the grounding wire in each of which silver is used are not easily damaged when being curved.

BRIEF DESCRIPTION OF THE DRAWINGS

FIG. 2 is a schematic plan view illustrating an example of the input device according to the present embodiment;

FIG. 4 is a schematic sectional view illustrating an example of a curved state of the extended portion;

FIG. 5A, FIG. 5B, and FIG. 5C are schematic plan views each illustrating an example of an end-portion projection line;

DESCRIPTION OF THE PREFERRED EMBODIMENTS

Hereinafter, an embodiment of the present invention will be described on the basis of the drawings. Note that, in the following description, identical members are given identical signs, and description of the members that have been once described is omitted, as appropriate.

Configuration of Input Device

Figure 1A:
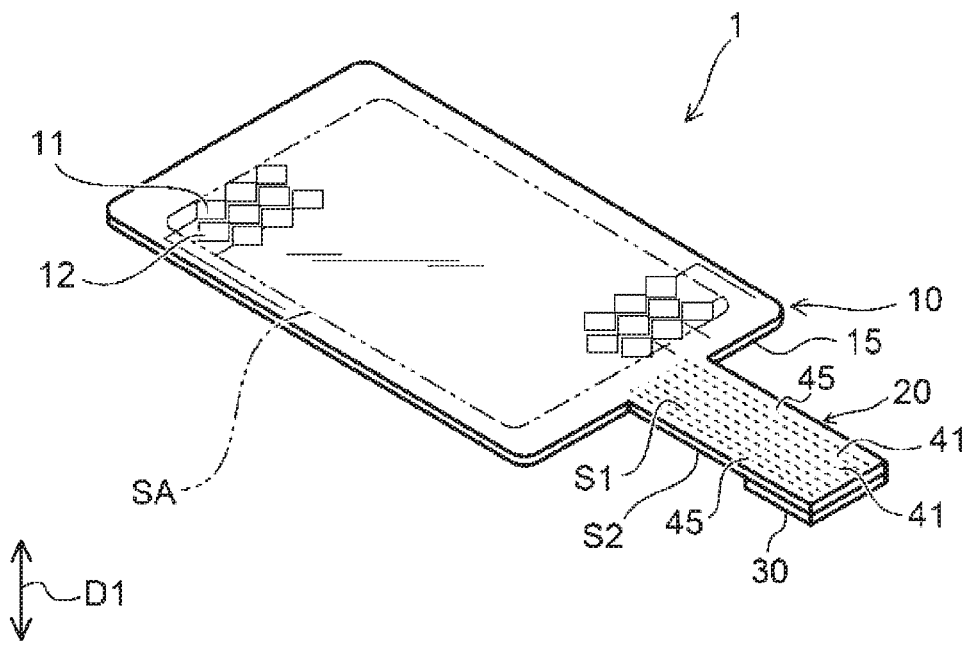
FIG. 1A and FIG. 1B are perspective views each illustrating an example of an input device according to the present embodiment.
Figure 1B:
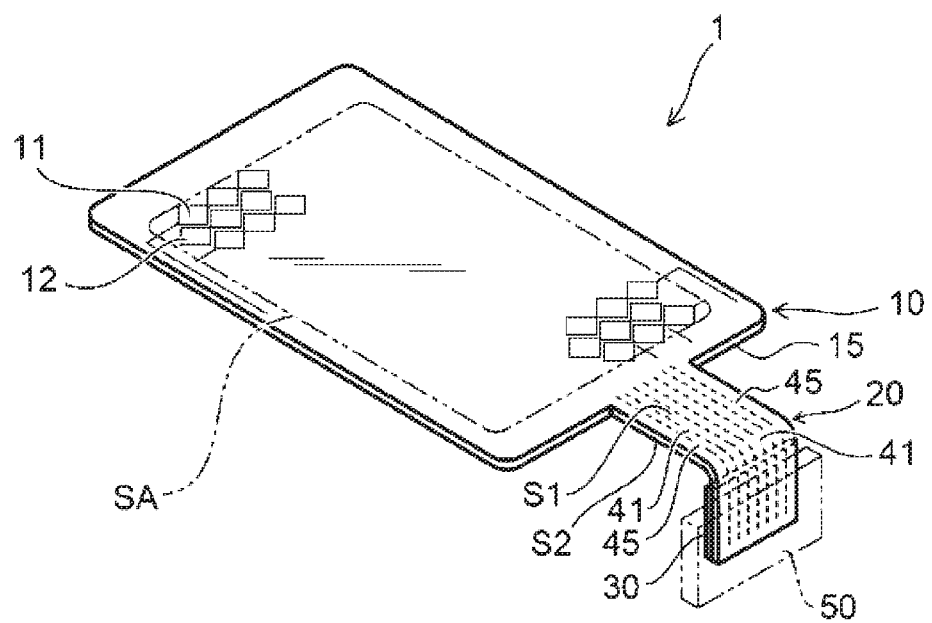
Figure 3:
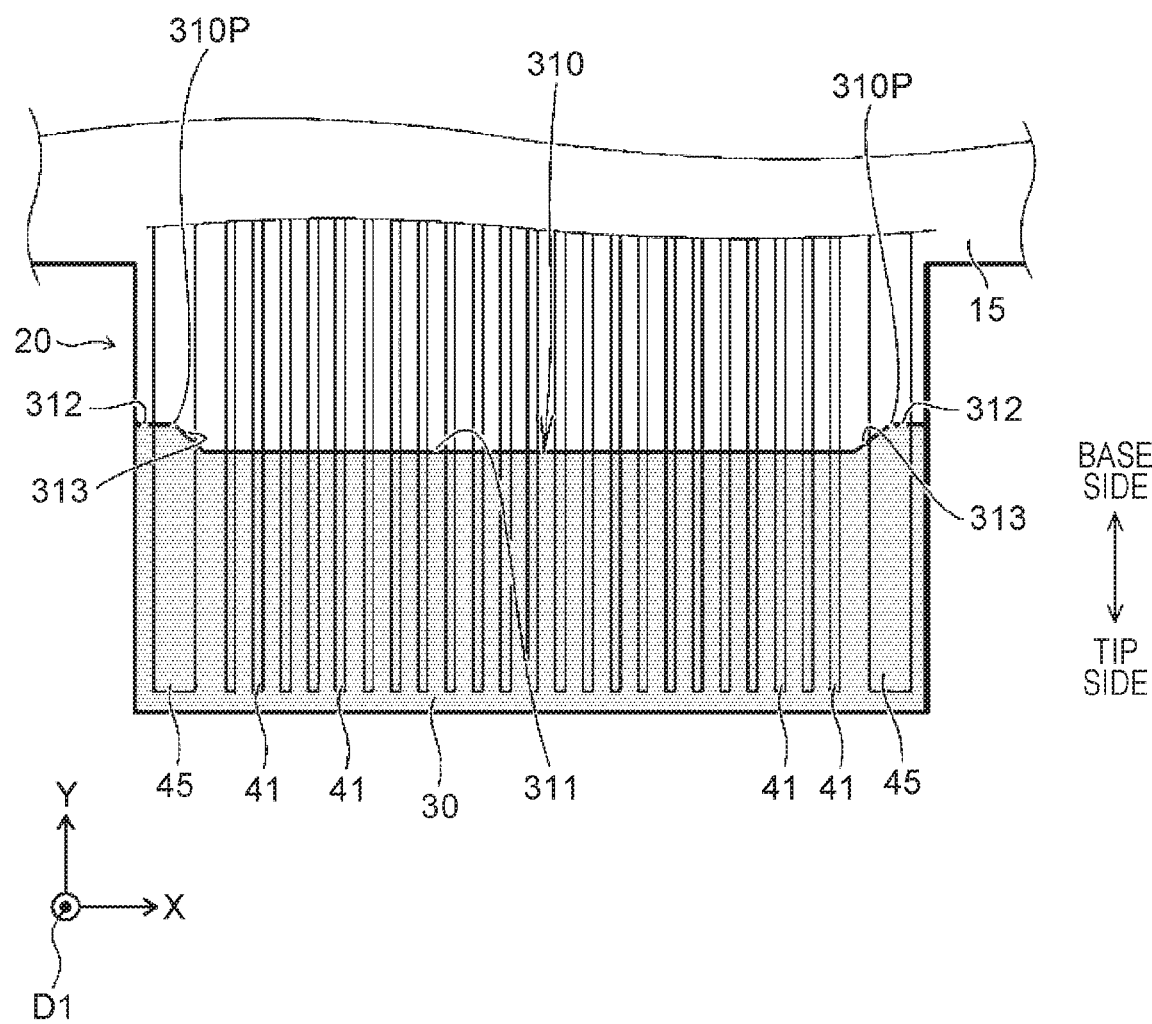
FIG. 3 is an enlarged schematic plan view of an extended portion.

FIG. 1A and FIG. 1B are perspective views each illustrating an example of an input device according to the present embodiment. FIG. 1A illustrates a state before an extended portion is curved, and FIG. 1B illustrates a state after the extended portion is curved. FIG. 2 is a schematic plan view illustrating an example of the input device according to the present embodiment. FIG. 3 is an enlarged schematic plan view of the extended portion. Note that, in FIG. 3, a reinforcement plate 30 is illustrated by being overlapped by lead-out wires 41 and grounding wires 45 for convenience of description.

As illustrated in FIG. 1A and FIG. 1B, an input device 1 according to the present embodiment includes a support base 15, a sensor unit 10 disposed on the support base 15, an extended portion 20 extending outward from the support base 15, the lead-out wires 41 and the grounding wires 45 disposed along a first major surface S1 of the extended portion 20, and the reinforcement plate 30 disposed on a second major surface S2 opposite to the first major surface S1 of the extended portion 20.

The input device 1 is, for example, a touch panel. The input device 1 may be mounted on a display apparatus (not illustrated) of liquid crystal or the like or may be mounted on a decoration portion (not illustrated). The sensor unit 10 is, for example, a capacitive touch sensor and performs position detection on the basis of a change in capacitance when a finger or the like has approached a detection region SA. The sensor unit 10 is disposed on the support base 15 of a molded resin or the like. The support base 15 is formed of, for example, a transparent flexible film of PET (polyethylene terephthalate), COP (cycloolefin polymer), COC (cyclic olefin copolymer), or the like, or a hard transparent plate material of an acrylic resin, a polycarbonate resin, or the like. The detection region SA in the support base 15 is provided with first electrodes 11 and second electrodes 12, which are transparent electrode portions.

The first electrodes 11 are disposed to extend in one direction (for example an X direction) along the surface of the support base 15. The second electrodes 12 are disposed to extend in a direction (for example, a Y direction) that is along the surface of the support base 15 and orthogonal to the one direction. The first electrodes 11 and the second electrodes 12 are insulated from each other. In the present embodiment, a plurality of the first electrodes 11 are disposed in the Y direction at a predetermined pitch, and a plurality of the second electrodes 12 are disposed in the X direction at a predetermined pitch.

There are various types of patterns of electrodes constituting the first electrodes 11 and the second electrodes 12. In the present embodiment, the first electrodes 11 and the second electrodes 12 each include a plurality of island electrode portions. Each island electrode portion has, for example, a shape similar to a rhombus shape. In the first electrodes 11 and the second electrodes 12, transparent conductive materials (ITO (indium tin oxide), $SnO_2$, ZnO, a conductive nanomaterial, a mesh-shaped metal material, and the like) are used.

A handling pattern 150 in conduction with the first electrodes 11 and the second electrodes 12 is disposed to extend in a peripheral area that is on the outer side of the detection region SA of the support base 15. The handling pattern 150 is in conduction with the lead-out wires 41, thereby extending conductor wires for the first electrodes 11 and the second electrodes 12 from the peripheral area to the tip part of the extended portion 20.

The extended portion 20 is a portion provided to extend outward from the edge part of the support base 15 and may be integral with the support base 15 or may be connected to the support base 15 as a different body. In the extended portion 20, a flexible film material of PET, COP, COC, or the like is used.

On the extended portion 20, a plurality of the lead-out wires 41 in conduction with the first electrodes 11 and the second electrodes 12 are disposed parallel to each other. Each lead-out wire 41 extends along the first major surface S1 of the extended portion 20 from the side of the support base 15 toward the tip. In addition, on the extended portion 20, the grounding wires 45 are disposed adjacent to the plurality of lead-out wires 41. For example, the grounding wires 45 are disposed one each on both sides of the extended portion 20 in the width direction thereof. The wire width of each grounding wire 45, which serves as ground potential, is greater than the wire width of each lead-out wire 41. In the present embodiment, the lead-out wires 41 and the grounding wires 45 are each formed of a material containing silver (Ag). Using a material containing silver as the lead-out wires 41 and the grounding wires 45 achieves low resistance compared with ITO and the like.

The reinforcement plate 30 is disposed on a part of the second major surface (counter face opposite to the first major surface S1 on which the lead-out wires 41 and the grounding wires 45 are disposed) S2 of the extended portion 20, the part being on the side of the support base 15 from the tip of the extended portion 20. The reinforcement plate 30 is a plate for reinforcing the strength of the support base 15 and formed of, for example, a flexible film of PET, COP, COC, or the like, or a hard plate material of an acrylic resin, a polycarbonate resin, or the like. For example, in the present embodiment, the thickness of the extended portion 20 is approximately 50 μm, and the thickness of the reinforcement plate 30 is approximately 300 μm. Provision of the reinforcement plate 30 on the tip part of the extended portion 20 enables the extended portion 20 to be reliably inserted into a connector 50, as illustrated in FIG. 1B.

Here, in the present embodiment, a normal direction of the second major surface S2 of the extended portion 20 is referred to as a first direction D1. In the input device 1, when the reinforcement plate 30 is viewed in the first direction D1, an end-portion projection line (an inner edge contour) 310 formed by an end portion (base-side end portion, or inner edge) of the reinforcement plate 30 on the side of the support base 15 is a nonlinear (non-straight) line. In other words, the end-portion projection line 310 is linear (substantially straight) in a part overlapping the lead-out wires 41 but is a nonlinear line (non-straight line) as an overall shape because of having nonlinear portions in parts other than the overlapping part. As a result, the end-portion projection line 310 is positioned, at a width-direction center portion of the extended portion 20 on which the lead-out wires 41 are disposed, relatively on the tip side and positioned, at width-direction end portions of the extended portion 20 on which the grounding wires 45 are disposed, relatively on the base side.

As illustrated in FIG. 3, a most-protruding location 310P in the end-portion projection line 310 closest to the base side overlaps the grounding wires 45 when viewed in the first direction D1. In the present embodiment, the grounding wires 45 are disposed one each on both sides of the extended portion 20 in the width direction thereof, and the most-protruding location 310P is disposed to overlap each of the grounding wires 45.

The end-portion projection line 310 preferably includes a first part 311 overlapping at least the lead-out wires 41, a second part 312 overlapping the grounding wires 45 and including the most-protruding location 310P, and a third part 313 overlapping the grounding wires 45 and disposed between the first part 311 and the second part 312. In the example illustrated in FIG. 3, each of the first part 311, the second part 312, and the third part 313 is disposed linearly. The first part 311 is positioned closer than the second part 312 to the tip side (a side opposite to the base side). The third part 313 is disposed obliquely. Note that "linear" ("substantially straight") in each part denotes that, regarding the end-portion projection line of each part, even if there are waves, the length of the waves is sufficiently larger than the width of each lead-out wire 41, and, even if there are fine recesses and protrusions corresponding to roughness, intervals between mutually adjacent protruding portions are sufficiently smaller than the width of each lead-out wire 41.

As illustrated in FIG. 3, the end-portion projection line 310 is disposed to be set back as a whole from the base side toward the tip side and such that the most-protruding location 310P, which is directed to be on the furthermost base side from the tip side, overlaps the grounding wires 45. Provision of the reinforcement plate 30 having such an end-portion projection line 310 enables, when the extended portion 20 is curved, a stress due to the curving to be concentrated on the vicinity of the most-protruding location 310P.

In the present embodiment, the most-protruding location 310P of the end-portion projection line 310 is disposed in a location overlapping the grounding wires 45. It is thus possible to cause a stress-concentrated portion when the extended portion 20 is curved to be on the grounding wires 45. In other words, it is possible to suppress the stress when the extended portion 20 is curved from being concentrated on the lead-out wires 41 by being concentrated on the grounding wires 45. Even when the stress is concentrated on the grounding wires 45, damage to electrical characteristics is small because the wire width of each grounding wire 45 is greater than the wire width of each lead-out wire 41.

FIG. 4 is a schematic sectional view illustrating an example of the curved state of the extended portion.

When the tip side of the extended portion 20 where the reinforcement plate 30 is disposed is curved, a stress is applied to the support base 15, the lead-out wires 41, and the grounding wires 45 with a fulcrum A at a portion of the support base 15 on a line extended from the edge of the reinforcement plate 30. In this case, if the lead-out wires 41 and the grounding wires 45 are on the outer side of the curve, there is a possibility of a crack C being generated due to a tensile stress.

In the present embodiment, it is possible to concentrate the stress when the extended portion 20 is curved onto the vicinity of the most-protruding location 310P because the most-protruding location 310P of the end-portion projection line 310 is disposed at the location overlapping the grounding wires 45. Even if the crack C is generated in the grounding wires 45 as a result of the stress being concentrated on the vicinity of the most-protruding location 310P, damage to the electrical characteristics is small, even when the crack C in some degree is generated, because the wire width of the grounding wires 45 is thick compared with the wire width of the lead-out wires 41. Therefore, it is possible to avoid influence of the stress when the extended portion 20 is curved from being exerted on the lead-out wires 41 having the thin wire width.

FIG. 5A to FIG. 5C are schematic plan views each illustrating an example of the end-portion projection line. FIG. 5A to FIG. 5C each schematically illustrate positional relation between a part of the end-portion projection line 310, and the lead-out wires 41 and the grounding wires 45.

The end-portion projection line 310 illustrated in FIG. 5A is an example in which the end-portion projection line 310 of the third part 313, among the first part 311, the second part 312, and the third part 313 constituting the end-portion projection line 310, is a part that is set back from the base side toward the tip side and connects the first part 311 and the second part 312 to each other without a bent portion.

By configuring such an end-portion projection line 310, it is possible to concentrate a stress on the vicinity of the most-protruding location 310P when the extended portion 20 is curved and to cause the stress to gradually decrease as a distance from the most-protruding location 310P increases. In particular, due to the first part 311 being positioned closer than the most-protruding location 310P to the tip side, it is possible to effectively suppress stress concentration onto the lead-out wires 41 overlapping the first part 311. If the third part 313 includes a bent portion, there is a possibility of a stress being concentrated locally onto the bent portion. Thus, due to the third part 313 including no bent portion, concentrating the stress on the vicinity of the most-protruding location 310P is more stably achieved.

In the end-portion projection line 310 illustrated in FIG. 5B, the first part 311 and the third part 313 are connected to each other by a curved line, and the second part 312 and the third part 313 are connected to each other by a curved line. While a most portion of each of the first part 311, the second part 312, and the third part 313 is constituted by a linear line, connection portions between the parts are constituted by smooth curved lines.

The more the end-portion projection line 310 includes linear lines, the easier the manufacture of the reinforcement plate 30. By connecting the connection portions of the first part 311, the second part 312, and the third part 313 with the smooth curved line, it is possible to buffer stress concentration onto the connection portions. In other words, the higher the curvature (the smaller the radius of curvature) between the parts, the more the stress is easily concentrated locally on the connection portions; thus, dispersing the stress by a configuration including such a smooth curved line enables suppression of crack generation in the lead-out wires 41 and the grounding wires 45. In addition, the linear first part 311 is positioned to also overlap the grounding wires 45, and the entirety of the recess-shaped third part 313 directed to the base side overlaps the grounding wires 45. In other words, all of the parts where the end-portion projection line 310 is nonlinear are concentrated on the grounding wires 45 to thereby sufficiently ensure the distance between the parts where the end-portion projection line 310 is nonlinear and the lead-out wires 41. Due to such a configuration, it is possible to reduce, in particular, a possibility of stress concentration being generated in the lead-out wires 41 when the extended portion 20 is curved.

In the end-portion projection line 310 illustrated in FIG. 5C, the second part 312 inclines to be closer to the tip side toward the outside from the most-protruding location 310P. Such an inclination of the second part 312 stably reduces the possibility of a stress being concentrated on an outermost end portion 312P (a portion overlapping an outer end of the extended portion 20 in the width direction thereof) of the second part 312 when the extended portion 20 is curved. If the stress is excessively concentrated on the outermost end portion 312P, there is a possibility of generation of a malfunction, such as separation of the reinforcement plate 30 from the extended portion 20, of a type different from the breakage of the wires. Accordingly, due to the end-portion projection line 310 having the configuration illustrated in FIG. 5C, it is possible to stably reduce the possibility of occurrence of such a malfunction.

Figure 6:
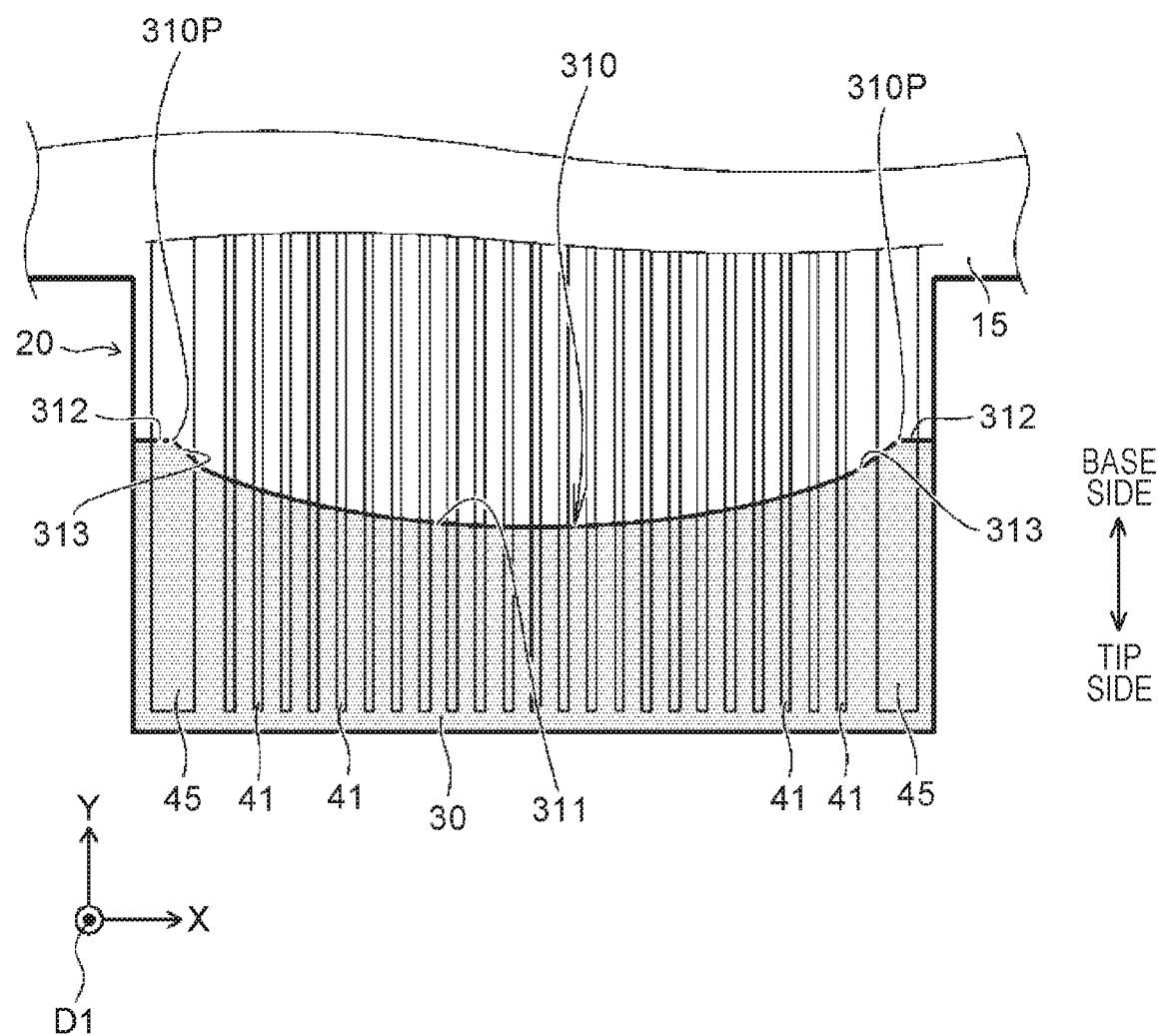
FIG. 6 is a schematic plan view illustrating another example of the end-portion projection line.

FIG. 6 is a schematic plan view illustrating another example of the end-portion projection line. Note that, in FIG. 6, the reinforcement plate 30 is illustrated by being overlapped by the lead-out wires 41 and the grounding wires 45 for convenience of description.

In the end-portion projection line 310 illustrated in FIG. 6, the first part 311 is a part that is gradually set back from the base side toward the tip side, and the second part 312 is a linear line or a part protruding from the tip side toward the base side.

Such a shape of the end-portion projection line 310 concentrates stress on the vicinity of the most-protruding location 310P when the extended portion 20 is curved and enables stress concentration onto the lead-out wires 41 overlapping the first part 311 to be effectively avoided, compared with when the first part 311 is constituted by a linear line.

Application Example

Figure 7:
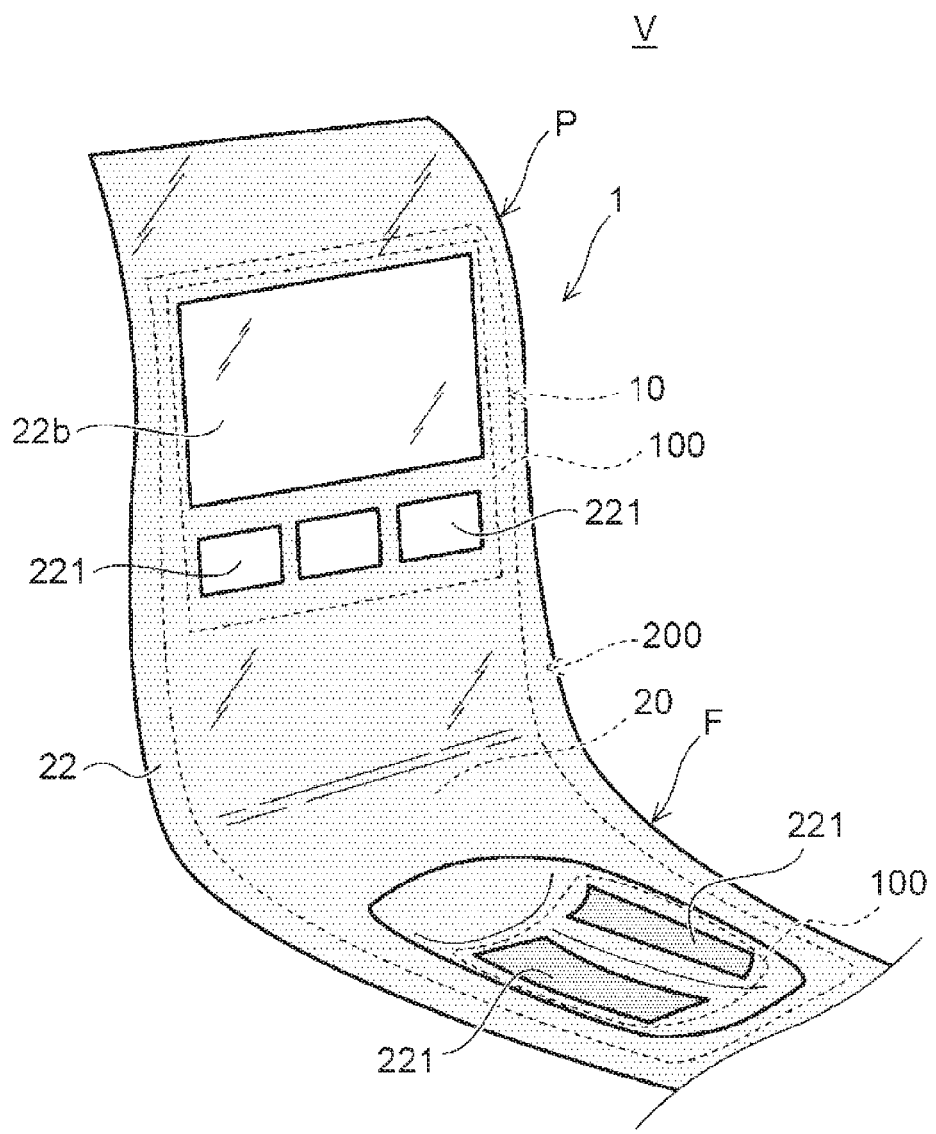
FIG. 7 is a schematic view illustrating an application example of the input device.

FIG. 7 is a schematic view illustrating an application example of the input device. FIG. 7 illustrates an example in which the input device 1 according to the present embodiment is applied to an instrument panel P and a floor console F of a movable body V, such as a vehicle or the like. The detection region SA of the input device 1 may be disposed continuous from the instrument panel P to the floor console F or may be divided into a part of the instrument panel P and a part of the floor console F.

For example, the instrument panel P includes a part (non-formation region 22b) on which a decoration layer 22 of a decoration film 200 is not disposed. In this part, a display device 100 is disposed. On the display device 100, the detection region SA is disposed and functions as a touch panel. The instrument panel P and the floor console F may be provided with button display portions 221 constituted by the decoration layer 22. Consequently, various operations are possible by touching the button display portions 221 of the decoration layer 22.

As described above, according to the present embodiment, it is possible to provide the input device 1 capable of suppressing damage to the lead-out wires 41 disposed on the extended portion 20, even when the extended portion 20 on which the reinforcement plate 30 is disposed is curved.

Although the present embodiment has been described above, the present invention is not limited to these examples. For example, although an example in which the width of the extended portion 20 is narrower than the width of the support base 15 is presented, the width of the extended portion 20 may be identical to the width of the support base 15. Moreover, the grounding wires 45 disposed on the extended portion 20 may be disposed on a center part of the extended portion in the width direction thereof. In this case, the second part 312 is disposed on the center part of the extended portion 20. In addition, the aforementioned embodiments to which addition, deletion, and design change of the constituent components are applied, as appropriate, by a person skilled in the art, and the features of the embodiments combined together, as appropriate, are also included in the scope of the present invention as long as including the spirit of the present invention.

What is claimed is:

1. An input device comprising:
   a support base;
   a sensor unit disposed on the support base and including a plurality of electrode parts;
   an extended portion extending outward from the support base, the extended portion having a first main surface and a second main surface opposite to the first main surface;
   a plurality of lead-out wires disposed on the first main surface of the extended portion so as to be in electrical conduction with the electrode parts;
   at least one grounding wire disposed on the first main surface of the extended portion, the grounding wire extending alongside the lead-out wires; and
   a reinforcement plate disposed on the second main surface of the extended portion, the reinforcement plate extending from an outer edge portion of the extended portion toward the support base so as to form an inner edge thereof without reaching the support base,
   wherein, when viewed from a direction normal to the second main surface of the extended portion,
      a width of the grounding wire is greater than a width of the lead-out wires,
      an inner edge contour formed by the inner edge of the reinforcement plate forms a non-straight line, and
      a tip portion of the inner edge contour closest to the support base is disposed at a position which overlaps the grounding wire,
   and wherein the inner edge contour of the support base includes:
      a first part overlapping at least the lead-out wires;
      a second part including the tip portion and overlapping the grounding wire; and
      a third part disposed between the first part and the second part, and including a portion overlapping the grounding wire.

2. The input device according to claim 1, wherein the third part consist of the portion overlapping the grounding wire.

3. The input device according to claim 1, wherein at least one of the first part, the second part, and the third part includes is a substantially straight line.

4. The input device according to claim 1, wherein the third part includes a substantially straight line extending between the first part and the second part such that the inner edge contour becomes away from the support base as the substantially straight line extends from the second part toward.

5. The input device according to claim 1, wherein the first part and the third part are connected to each other by a curved line, and the second part and the third part are connected to each other by a curved line.

6. The input device according to claim 1,
   wherein the first part of the inner end contour includes a substantially straight line, or is a part of the inner end contour which is farthest from the support base, viewed from the direction normal to the second main surface, and
   wherein the second part of the inner end contour includes a substantially straight line, or a part of the inner end contour which protrudes toward the support base so as to be closest thereto, viewed from the direction normal to the second main surface.

7. The input device according to claim 1, wherein the plurality of lead-out wires and the grounding wire contain silver.

* * * * *